United States Patent [19]
Akins et al.

[11] Patent Number: 5,472,828
[45] Date of Patent: Dec. 5, 1995

[54] ABLATIVE PROCESS FOR PRINTED CIRCUIT BOARD TECHNOLOGY

[75] Inventors: Rickey D. Akins; John Walvoord, both of Orlando, Fla.

[73] Assignee: Martin Marietta Corporation, Bethesda, Md.

[21] Appl. No.: 193,660

[22] Filed: Feb. 7, 1994

Related U.S. Application Data

[63] Continuation of Ser. No. 901,789, Jun. 22, 1992, abandoned.
[51] Int. Cl.$^6$ ........................................... G03F 7/24
[52] U.S. Cl. ..................... 430/318; 430/311; 430/313; 430/323; 430/396; 430/945; 216/65; 216/13; 216/59; 216/48
[58] Field of Search ..................... 430/311, 313, 430/318, 323, 396, 397, 945; 156/643, 652, 659.1, 661.1, 902

[56] References Cited

U.S. PATENT DOCUMENTS

| | | | |
|---|---|---|---|
| 3,220,331 | 11/1965 | Evans et al. | 355/78 |
| 3,578,862 | 5/1971 | Hudock et al. | 355/104 |
| 3,591,285 | 6/1971 | Hakegi et al. | 355/91 |
| 3,649,394 | 3/1972 | Erickson, Jr. | 430/320 |
| 3,694,080 | 9/1972 | Malsky | 355/86 |
| 3,815,993 | 6/1974 | Tarabocchia | 355/78 |
| 3,988,066 | 10/1976 | Suzuki et al. | 355/78 |
| 4,102,734 | 7/1978 | Schiffman | 156/659 |
| 4,151,040 | 4/1979 | Schiffman | 156/659 |
| 4,288,528 | 9/1981 | Picquendar et al. | 430/297 |
| 4,587,205 | 5/1986 | Harrah et al. | 430/326 |
| 4,588,801 | 5/1986 | Harrah et al. | 528/33 |
| 4,780,177 | 10/1988 | Wojnarowski et al. | 156/643 |
| 4,842,677 | 6/1989 | Wojnarowski et al. | 156/643 |
| 4,860,023 | 8/1989 | Halm | 343/912 |
| 4,870,751 | 10/1989 | Antoon | 29/846 |
| 4,940,881 | 6/1990 | Sheets | 219/121.69 |
| 4,964,940 | 10/1990 | Auvert et al. | 156/345 |
| 4,999,277 | 3/1991 | Haddock et al. | 430/269 |
| 5,106,455 | 4/1992 | Jacobsen et al. | 156/659.1 |

FOREIGN PATENT DOCUMENTS

| | | |
|---|---|---|
| 0261356 | 3/1988 | European Pat. Off. . |
| 2184855 | 7/1987 | United Kingdom . |

OTHER PUBLICATIONS

Thomas A. Znotins et al., "Excimer Lasers: An Emerging Technology in Materials Processing", *Laser Focus/Electro-Optics*, vol. 23, No. 5, May 1987, pp. 54–70.

Primary Examiner—Kathleen Duda
Attorney, Agent, or Firm—Burns, Doane Swecker & Mathis

[57] ABSTRACT

In a method for fabricating a printed circuit board on a doubly contoured or hemispherical substrate such as a radome, a coherent light source is used to form a plurality of elements of a predetermined pattern on the surface of the substrate. The substrate includes a bottom layer and a metallized layer. At least a first element of the pattern is formed by ablating the element into a resist coating or ablating the element into the metallized layer with the coherent light source. The coherent light source preferably includes an excimer laser. The substrate is then displaced relative to the coherent light source until all the elements of the predetermined pattern are formed over the entire surface of the substrate. When the pattern is ablated into the resist material, an etching technique is used to remove portions of the metallized layer from the substrate.

13 Claims, 8 Drawing Sheets

ABLATIVE PROCESS FOR PRINTED CIRCUIT BOARD TECHNOLOGY

CROSS REFERENCE

This application is a continuation of Application Ser. No. 07/901,789, filed Jun. 22, 1992, now abandoned.

This application is related to another patent application Ser. No. 07/904,688, filed Jun. 26, 1992 entitled "Direct Laser Imaging For Three-Dimensional Circuits And The Like", in the name of Ricky Akins and John Walvoord, and assigned to the assignee of the present application.

FIELD OF THE INVENTION

The present invention relates generally to a method for fabricating a substantially nonplanar substrate having a predetermined pattern. More particularly, the present invention relates to a method for fabricating a frequency selective surface or a printed circuit board, on to a radome or other structure having a doubly contoured or hemispherically shaped surface, by ablating the predetermined pattern into a resist layer and removing portions of a corresponding metallized layer or by ablating the predetermined pattern into a metallized layer.

Background of the Invention

A radome is a housing for an antenna, radar or any type of seeker, and it is typically found on aircraft, missiles, submarines, moving vehicles or used in land based or space communications systems. A radome housing may include shapes such as a hemisphere, ogive, cone, cube, etc. A radome having a frequency selective surface (FSS) allows predetermined frequencies to pass through the housing, and it prevents undesired frequencies from penetrating the housing. When a FSS is used as a reflecting surface, it allows all frequency bands except one to pass, e.g., a bandstop reflector. The inverse of a bandstop is a bandpass. Frequency selective surfaces have been produced in much the same way as printed circuit boards. The main difference is that the FSS is usually printed on a three-dimensional doubly curved structure as in the case of a large class of radomes. Initially, a photoresist coating is applied to a metal surface such as copper. A photomask of an element pattern is created using photolithography techniques or other methods and the element image is transferred to the copper surface using a standard incoherent ultraviolet (UV) light source. A photodeveloper removes the photoresist and exposes the copper which allow acid etching of the surface to create the final pattern.

Figure 1A:
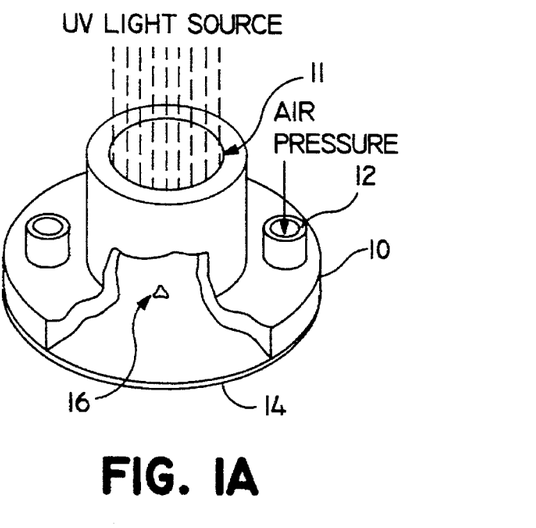
FIG. 1A is an isometric view of a contact imaging head used for imaging, but it cannot ablate material.
Figure 1B:
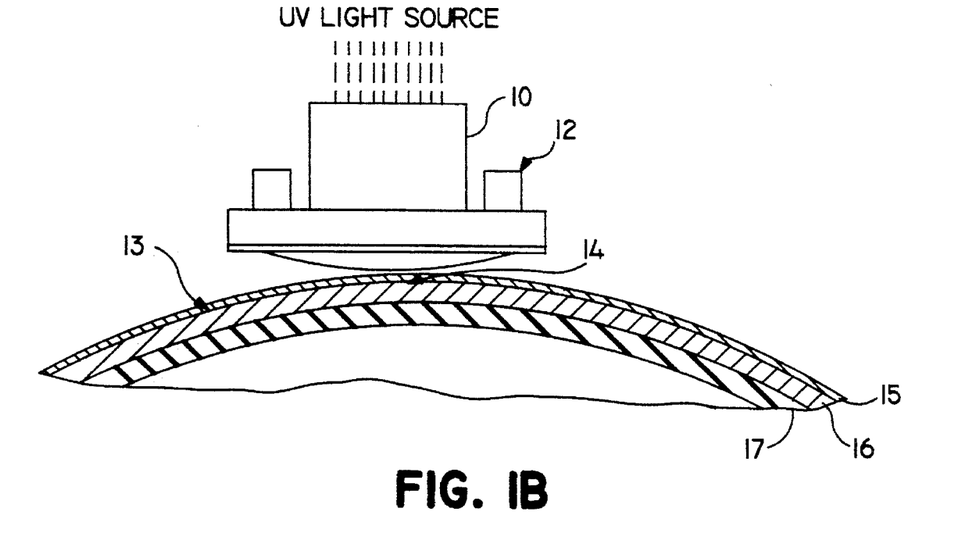
FIG. 1B is a side view of the contact imaging head and a doubly contoured substrate.

An example of a possible apparatus for fabricating a frequency selective surface on a radome is illustrated in FIGS. 1A and 1B. FIG. 1A illustrates an isometric view of an imaging head 10 used to form a pattern on a radome. A UV incoherent light source is disposed above an aperture 11. A source of air pressure is introduced through an inlet 12. As illustrated in the side view of FIG. 1B, the imaging head 10 is applied against a substrate 13 having a polymer layer 17, a metallized layer 16, and a photoresist coating 15. The bladder or photomask 14 of the imaging head 10 is forced against the substrate 13 by air pressure introduced through the inlet 12. The photomask 14 includes an element 16 of an image to be formed upon the photoresist coating 15 coveting the substrate 13. The imaging head 10 is moved across the surface of the substrate 13 until all of the desired elements 16 are formed in the photoresist 15.

The imaging technique of FIGS. 1A and 1B requires a substantial amount of time, and the accuracy of the pattern of elements can be compromised. The technique requires intimate contact of the mask 14 with the substrate 13 being imaged. This causes the mask 14 to degrade with time and to block UV transmission which compromises the accuracy of the pattern generated. Also, the UV light source itself can degrade with time and cause pattern accuracy problems.

Accordingly, there is a need for an improved technique for fabricating doubly contoured substrates which overcomes the disadvantages associated with the above-described contact imaging technique.

SUMMARY OF THE INVENTION

The present invention provides an improved method for fabricating a substantially nonplanar substrate, such as a doubly contoured radome or printed circuit board, having a plurality of elements which form a predetermined pattern. The substrate is typically comprised of a polymer layer and a metallized layer. The metallized layer may be coated with a resist layer. A first element of the predetermined pattern is then ablated into the resist material using a mask and a coherent light source, or the first element is ablated into the metallized layer, if no resist layer is employed. Preferably, the coherent light source includes an excimer laser. The doubly contoured substrate is then displaced relative to the coherent light source. The elements of the predetermined pattern continue to be ablated into the substrate until the predetermined pattern is formed over the entire surface of the substrate. If a resist layer is employed, portions of the metallized layer corresponding to the predetermined pattern are then etched away conventional techniques.

DETAILED DESCRIPTION OF THE INVENTION

The present invention takes advantage of a coherent light source such as an excimer laser to overcome the above-described problems associated with contact imaging heads. An excimer laser is a highly efficient and high power source of pulsed UV radiation. Since the excimer laser is of such high power, the amount of time needed to expose a photoresist material is very small, on the order of 20 nanoseconds. This allows for the potential of continuously spinning the substrate to be imaged and exposing it at a high rate of speed. The shuttering of the laser and the position of the substrate is preferably computer controlled. Imaging of a predetermined pattern can be accomplished by firing the laser through a reticle plate (objective lens) and a focusing lens onto the substrate covered with photoresist. As hereinafter described, a variety of additional components can be used to steer the beam or keep the image in focus.

Figure 2A:
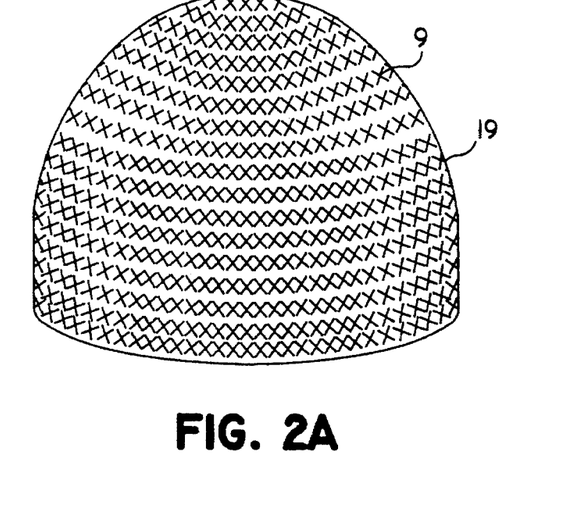
FIG. 2A is an isometric view of a radome having a predetermined pattern of x-shaped elements.

Referring now to FIG. 2A, an isometric view of a radome 19 is illustrated. The radome 19 is typically an ogive, a hemispherically shaped surface, or doubly contoured surface made from a polymer substrate having a metallized layer with selective portions 9 of the metallized layer removed. In FIG. 2A the selective portions are x-shaped slots 9. It is also possible to employ other predetermined shapes such as dipole elements or the y-shaped slots 9' of FIG. 2C. The radome 19 is capable of selectively passing or reflecting desired frequencies through the metallized layer.

Figure 2B:
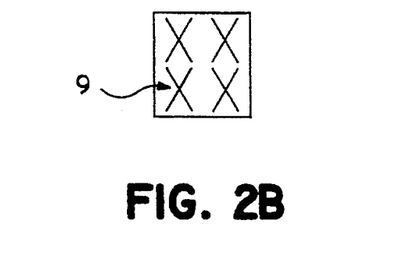
FIG. 2B is an enlarged portion of the surface of the radome of FIG. 2A.
Figure 2C:
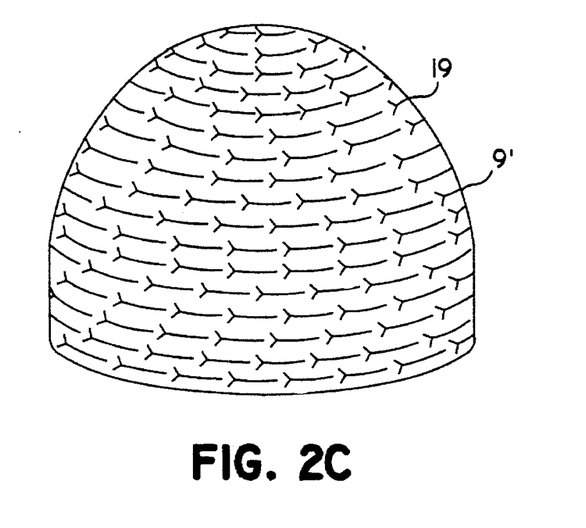
FIG. 2C is an isometric view of a radome having a predetermined pattern of y-shaped elements.

In FIG. 2B, there is an illustration of an enlarged portion of the surface of the radome 19 of FIG. 2A. The enlarged portion includes a plurality of x-shaped elements 9 which form a predetermined pattern. Preferably the x-shaped elements 9 are arranged in a spiral fashion as illustrated in FIG. 2A. The x-shaped elements 9 are also preferably arranged such that the distal ends of each x-shaped element are in close proximity to the distal ends of adjacent x-shaped element as illustrated in FIG. 2B. Such an arrangement permits a high density of x-shaped elements 9 to be disposed across the surface of the radome 19.

The present invention is not limited to the fabrication of radomes. The same inventive techniques can be employed in the fabrication of substantially nonplanar printed circuit boards or in the fabrication of Faraday cages. Faraday cages, which are sometimes referred to as electrostatic screens, are used to reduce the electromagnetic interference generated by electrical equipment and power supplies.

Figure 3A:
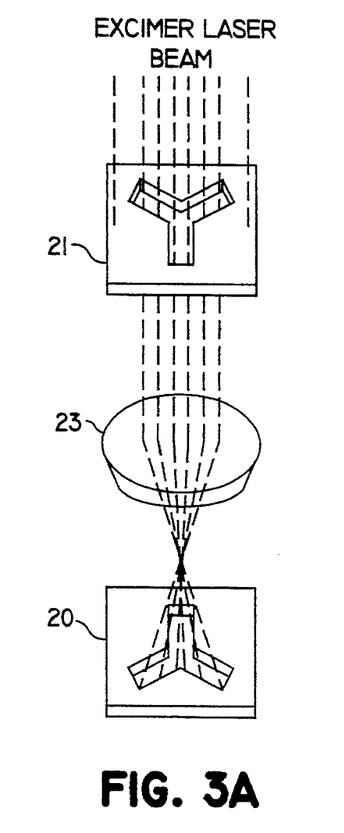
FIG. 3A is an isometric view of a first embodiment of the present invention using a photoresist technique for forming the predetermined pattern.

Referring now to FIG. 3A, a first embodiment of the present invention is illustrated. In the first embodiment of the present invention, a coherent light source, such as an excimer laser, is used to form directly an image of a trislot element on a substrate 20 which is coated with a photoresist material 26. The first or bottom layer 24 of the substrate may be formed from any suitable material such as glass, ceramic, polymer, etc. The light from the excimer laser passes through a photomask 21 or a reticle in order to create an image of the element in the photoresist material 26. The element image is focused onto the photoresist 26 by a lens 23.

The reticle 21 may be fabricated by using a laser to cut a slot in a 0.01 thick stainless steel sheet or other means such as e-beam, standard PCB, etc. The reticle allows predetermined areas of the photoresist 26 material to be illuminated, and the illuminated areas of the photoresist 26 are removed using well known photochemistry techniques. The photoresist 26 illustrated in FIG. 3C is a positive photoresist, but a negative photoresist may also be employed. The substitution of a negative photoresist would be readily apparent to those skilled in the art. When the resist material 26 corresponding to the trislot element is removed, a portion of the underlying copper surface 25 is exposed. The exposed copper surface 25 is then etched away using conventional photochemistry techniques to form the slotted element illustrated in FIG. 3B.

According to the present invention, it is also possible to use "lift off" technology when fabricating a printed circuit board or a radome. "Lift-off" technology includes the deposition of a relatively thick layer of photoresist on the substrate. The photoresist is imaged and portions of the substrate are exposed. The substrate and photoresist are then metallized with the metallization adhering firmly to the exposed portions of the substrate. Since the photoresist is so thick, vertical surfaces of the photoresist are not metallized. The relatively thick layer of photoresist and metallization coveting the photoresist are then removed using a suitable solvent.

Figure 3B:
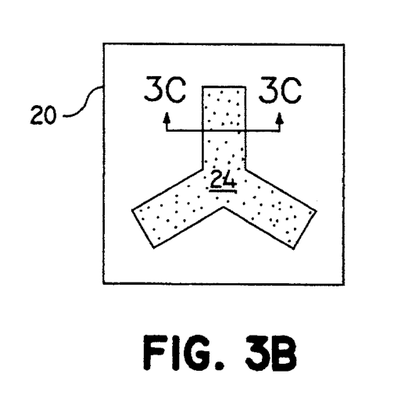
FIG. 3B is a planar view of an element of one particular predetermined pattern formed on a substrate.
Figure 3C:
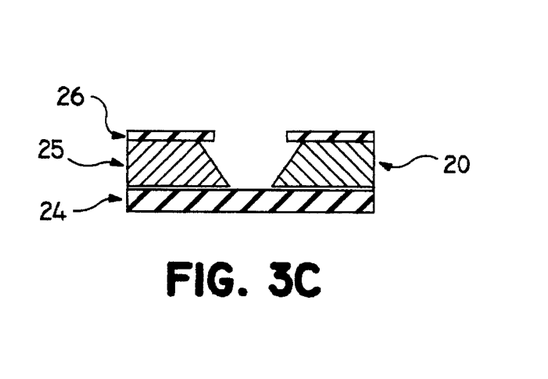
FIG. 3C is a cross-sectional view of the substrate illustrated in FIG. 3B.

A cross-sectional area of the element illustrated in FIG. 3B is provided in FIG. 3C. From FIG. 3C it can be appreciated that the substrate 20 is preferably comprised of an underlying polymer layer 24, a slotted metallized or copper layer 25 and a photoresist layer 26. The photoresist layer 26 is preferably removed once all the elements have been etched or formed in the copper layer 25.

Figure 4A:
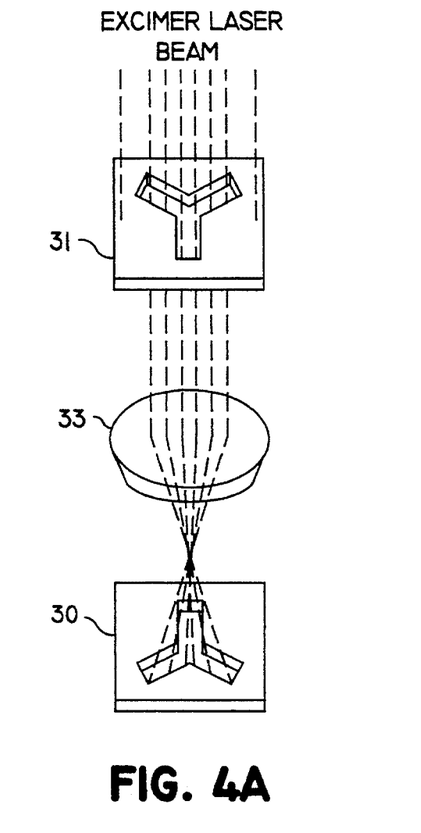
FIG. 4A is an isometric view of a second embodiment of the present invention using a technique for ablating a resist layer formed on the substrate.
Figure 4B:
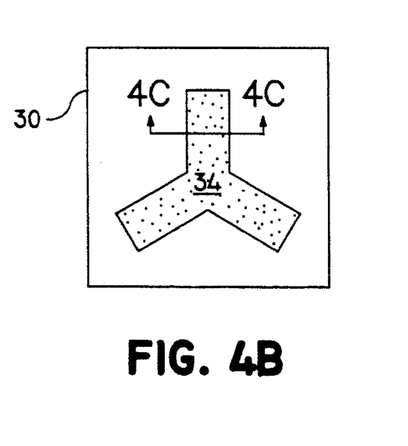
FIG. 4B is a planar view of an element of a particular predetermined pattern utilizing the second embodiment of the present invention.
Figure 4C:
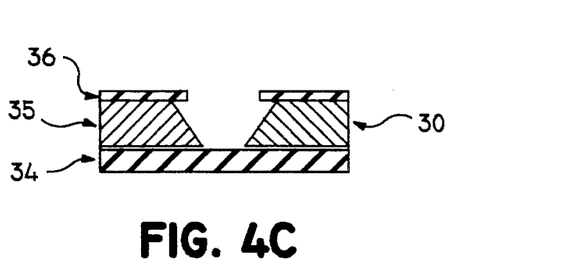
FIG. 4C is a cross-sectional view of the substrate illustrated in FIG. 4B.

Referring now to FIG. 4A, an isometric view of the second embodiment of the present invention is illustrated. In the second embodiment of the present invention an excimer laser beam is used to illuminate a pattern element formed in a reticle 31. The reticle 31 is preferably made of a metal having a much higher fluency threshold than a resist material 36 which covers the substrate 30. The image of the trislot element in the reticle 31 is focussed onto the substrate 30 by the lens 33. The substrate 30 is preferably comprised of a polymer layer 34, a metallized or copper layer 35 and a resist layer 36, as illustrated in FIG. 4C. The light from the excimer laser is used to ablate the resist layer 36. The resist layer 36 may be formed from a suitable polymer coating, and it may be used as a permanent surface coating for the copper layer 35. When the resist layer 36 has been ablated by the energy from the excimer laser, the underlying copper layer 35 is exposed. The exposed copper layer 35 can then be etched using conventional photochemistry techniques to form elements of the pattern in the copper layer as illustrated in FIG. 4B.

Figure 5A:
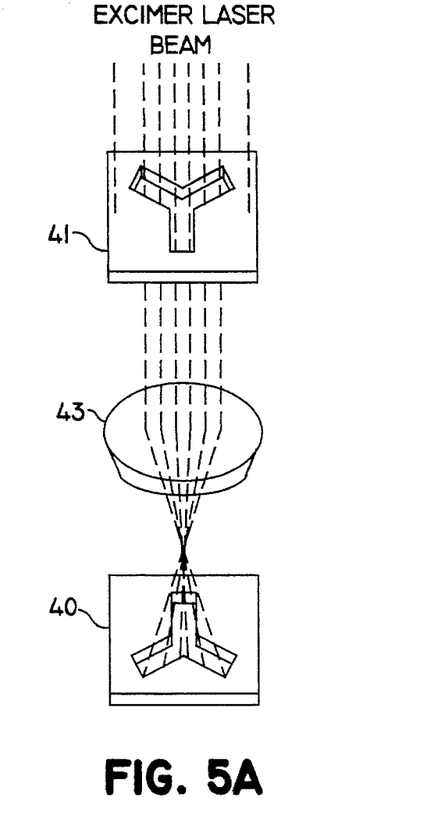
FIG. 5A is an isometric view of a third embodiment of the present invention utilizing a technique for ablating a metallized substrate.
Figure 5B:
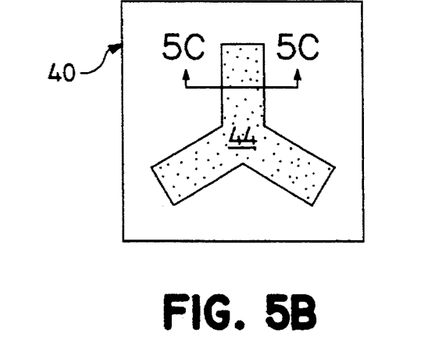
FIG. 5B is a planar view of an element of a particular predetermined pattern formed using the third embodiment of the present invention.
Figure 5C:
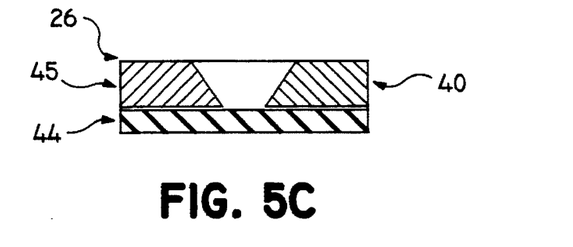
FIG. 5C is a cross-sectional view of the substrate illustrated in FIG. 5B.

Referring now to FIG. 5A, a third embodiment of the present invention is illustrated. In the third embodiment of the present invention, the power of the excimer laser is used to ablate an element of a pattern in a substrate 40. The substrate 40 preferably includes a steel layer 45 and bottom layer 44 formed of a suitable material such as a polymer, as illustrated in FIG. 5C. The illumination from the excimer laser passes through the reticle 41 and is focused by a lens 43 in order to ablate an image of the element in the steel layer 45. The element ablated into the substrate 40 is illustrated in FIG. 5B.

There are many advantages and some drawbacks of excimer laser ablation of the second and third embodiments, of the present invention. The non-thermal (localized heating) nature of the ablation process makes it a very attractive method for several reasons. It does not char or burn the surrounding substrate 30, 40. It allows the elimination of several critical process variable steps of the first embodiment including the photoresist application, developing time and imaging exposure time. Also, the configuration and dimensions can be continuously monitored using an on axis closed circuit television system (CCTV) as hereinafter described in connection with FIG. 8. The CCTV can also be adapted to provide real time computer control inspection of the ablation process prior to etching in connection with the second embodiment. This control results in a low scrap rate on high value added components. The major drawback of excimer ablation technique of the second and third embodiments, when compared to the excimer imaging technique of the first embodiment, is the amount of time the ablation process requires. The ablation techniques of FIGS. 4A and 5A will take about 0.7 second per element, whereas the laser imaging technique of FIG. 3A has the ability to image an element in a single 20 nanosecond pulse.

When using the laser ablation techniques of FIGS. 4A and 5A of the present invention, it has been observed that the working distance from the focusing lens (100 ram) to the work piece is not very critical. There appears to be about 0.05 inch movement in the Z axis where the image dimension does not significantly change. The position system of FIG. 8 can hold the working distance to within 0.001 inch. The resist 36 of FIG. 4A, which can be any coating that will withstand the acid etching, can have a thickness of approximately 6 microns. The thickness of the resist 36 also is not critical because the ablation process is self limiting. The laser ablates the resist 36 until the copper 35 is reached. The 6 micron resist 36 takes approximately 15 pulses at 50 pps using a laser energy of 350 millijoules with a beam size approximately 12×25 min.

Figure 7:
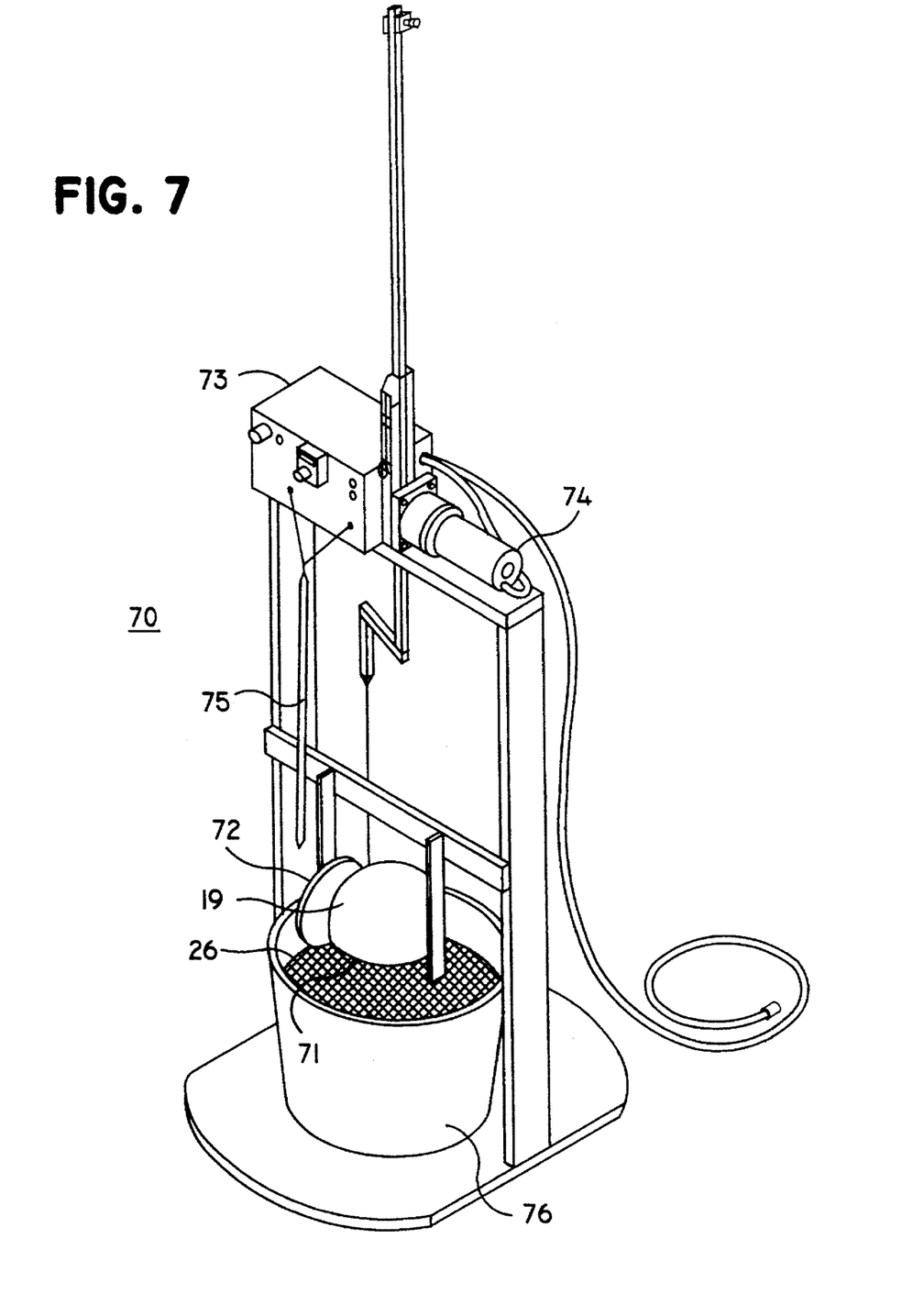
FIG. 7 is an isometric view of a device for coating a doubly contoured surface with a photoresist material.

A radome, as illustrated in FIG. 2A, can be fabricated using the techniques of the present invention. For example, it is possible to fabricate a radome having a hemispherical shape measuring 8 inches in diameter and 5 inches in height. The polymer layer of the radome can be injection molded from a polycarbonate material, and the metallizing layer can be fabricated using a process known as physical vapor deposition. The resist layer can be formed, for example, from the dipping technique illustrated in FIG. 7 and the resist layer can be prebaked at 80° C. for 20 minutes. The photoresist material can be AZ 1350J positive photoresist. A typical radome using these techniques and having these dimensions may have 8000 or more elements 9.

In practicing the laser imaging technique of the first embodiment of the present invention, it was found that the distance from the lens 23 to the substrate 20 is less critical than it was for the ablation method described above. For example, the laser output can be changed from 248 to 354 nanometers because the photoresist material 26 used, for example, Shipley 1350J is far more reactive at the 354 nm wavelength. Also, the optical set up can provide 2:1 magnification instead of 3:1 to achieve an appropriate energy density.

Figure 6:
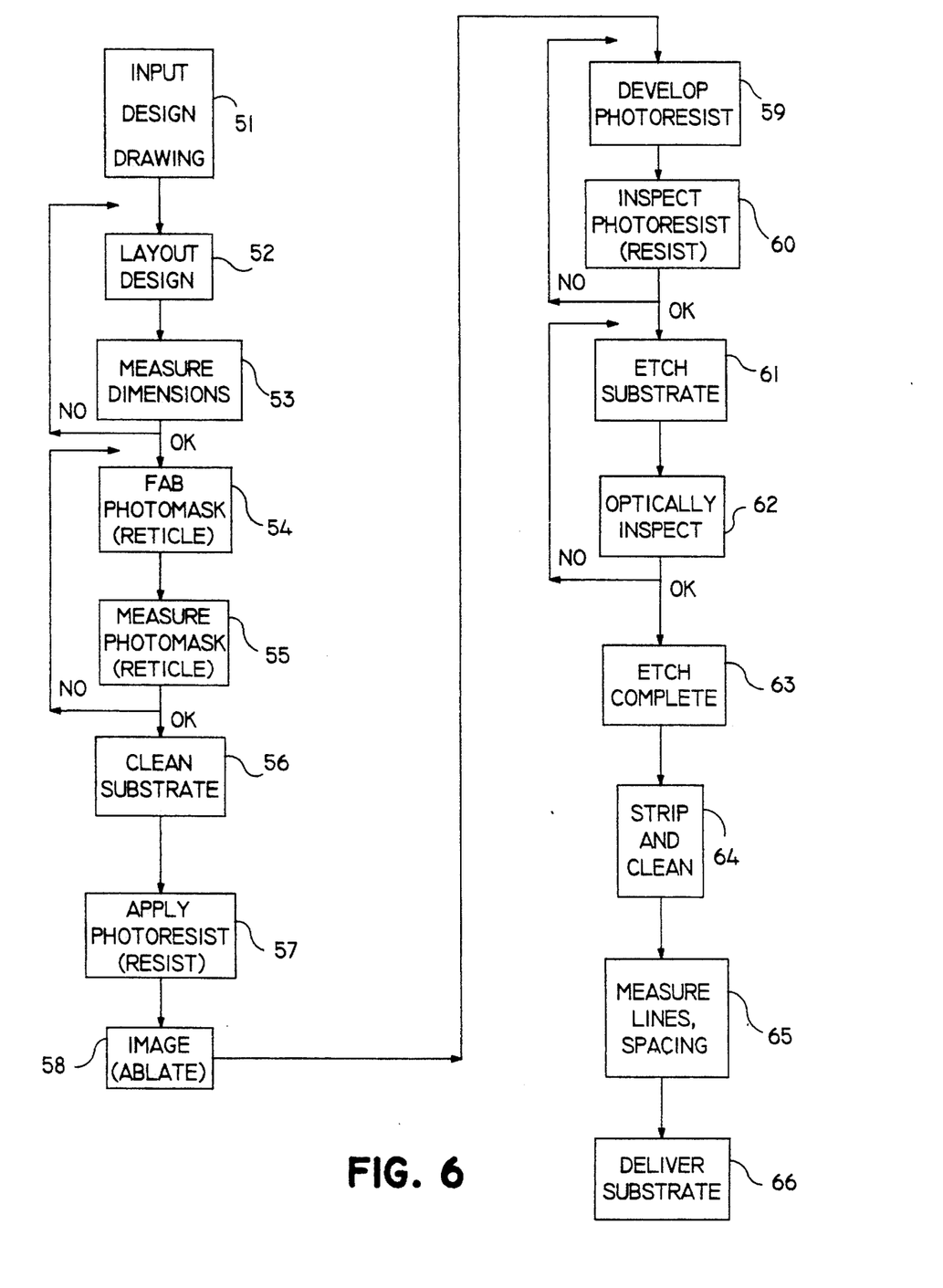
FIG. 6 is a flow diagram of the steps employed in the method of fabricating a substantially nonplanar substrate according to the present invention.

Referring now to FIG. 6, a flow diagram illustrates that various steps in practicing the three embodiments of the present invention. To the extent that there are differences in the three embodiments, the differences will be pointed out and explained. The first step of fabricating a substrate involves the initial inputting of a design drawing. The design drawing is based upon the particular printed circuit board design or an element pattern for a radome. There are various techniques for determining a pattern for a radome. One such technique is a periodic moment method computer code which is described in a final report published by Ohio State University in June 1989. In step 52 the layout design is accomplished and in step 53 the dimensions are measured to verify their accuracy.

Once the predetermined element pattern or printed circuit board design has been selected, a photomask or reticle is fabricated in step 54. Prior to actually using the photomask or the reticle, measurements of the photomask or reticle are made in step 55 in order to ensure the accuracy of the photomask or reticle.

The bottom layer and the metallized layer of the hemispherically shaped or substantially nonplanar substrate is fabricated and then thoroughly cleaned in step 56. In the first two embodiments of the invention, a photoresist coating 26 or a resist coating 36 is applied in step 57. A photoresist coating 26 is applied in the first embodiment of the invention and a resist coating 36 is applied in the second embodiment of the invention. Preferably, the photoresist coating 26 can be applied using the dipping device 70 of FIG. 7 which illustrates a hemispherical radome 19 being coated. The radome 19 is disposed on a tripod support 71. A pulley 72 is connected to a controller 73 and a motor 74 via a wire and spring system 75. When the motor 74 is actuated, the pulley 72 rotates causing the tripod 71 to rotate 180°. The radome 19 is rotated into the photoresist coating 26 stored in the container 76. The pulley is then rotated in the opposite direction which causes the first half of the radome to be withdrawn from photoresist material 26. The pulley 71 continues to rotate until the other half of the radome 19 is dipped into the photoresist material 26. The rotation of the radome out of the photoresist material 26 causes an even coating of the photoresist material 26 to be applied to the radome 19. The rotation of the radome 19 out of the photoresist material 26 is done at a very precise speed. A slower rotation out of the photoresist causes a thinner coating to be applied.

Referring back to FIG. 6, in the first embodiment of the invention, a step 58 is performed in which the image is formed in the photoresist coating 26. The substrate 20 is then displaced using the apparatus of FIG. 8 which hereinafter is described in greater detail. The imaging step 58 is repeatedly performed until the image is formed over the entire surface of the substrate 20. In step 59 the photoresist 26 is then developed, and in step 60 it is inspected to ensure that the predetermined portions of the metallized layer 25 have been exposed. In step 61 the predetermined portions of the metallized layer 25 are etched. The predetermined portions are optically inspected in step 62, and the etching process is completed in step 63.

In the second embodiment of the invention, the step 58 includes the process of ablating the predetermined portions of the resist 36 instead of imaging the photoresist. The next step in the second embodiment of the invention includes the step 60 of inspecting the resist 36 to ensure that the desired portions of the metallized layer 35 have been exposed. The exposed portions of the metallized layer 35 are then etched in accordance with steps 61–63 as in the first embodiment.

In the first and second embodiments of the invention, when optical inspection confirms that the etching is complete in step 63, then the substrates 20, 30 are stripped and cleaned in step 64. The substrates 20, 30 are then measured in step 65 to ensure the accuracy of the pattern, and in step 66 the substrates 20, 30 are ready for delivery.

In the third embodiment of the present invention steps 57, 59, 60, 61 and 64 are not necessary. In the third embodiment, the excimer laser performs the step 58 of a ablating the desired portion of the metallized layer 45 corresponding to the predetermined pattern. In other words, in the third embodiment, step 58 includes ablating a first element of the pattern in the metallized layer 45, displacing the substrate 40 relative to the coherent light source, ablating another element of the predetermined pattern, and continuing the ablation and displacement of the substrate 40 until the pattern is completely formed over the entire surface of the substrate 40. In step 62 the substrate is optically inspected.

Figure 8:
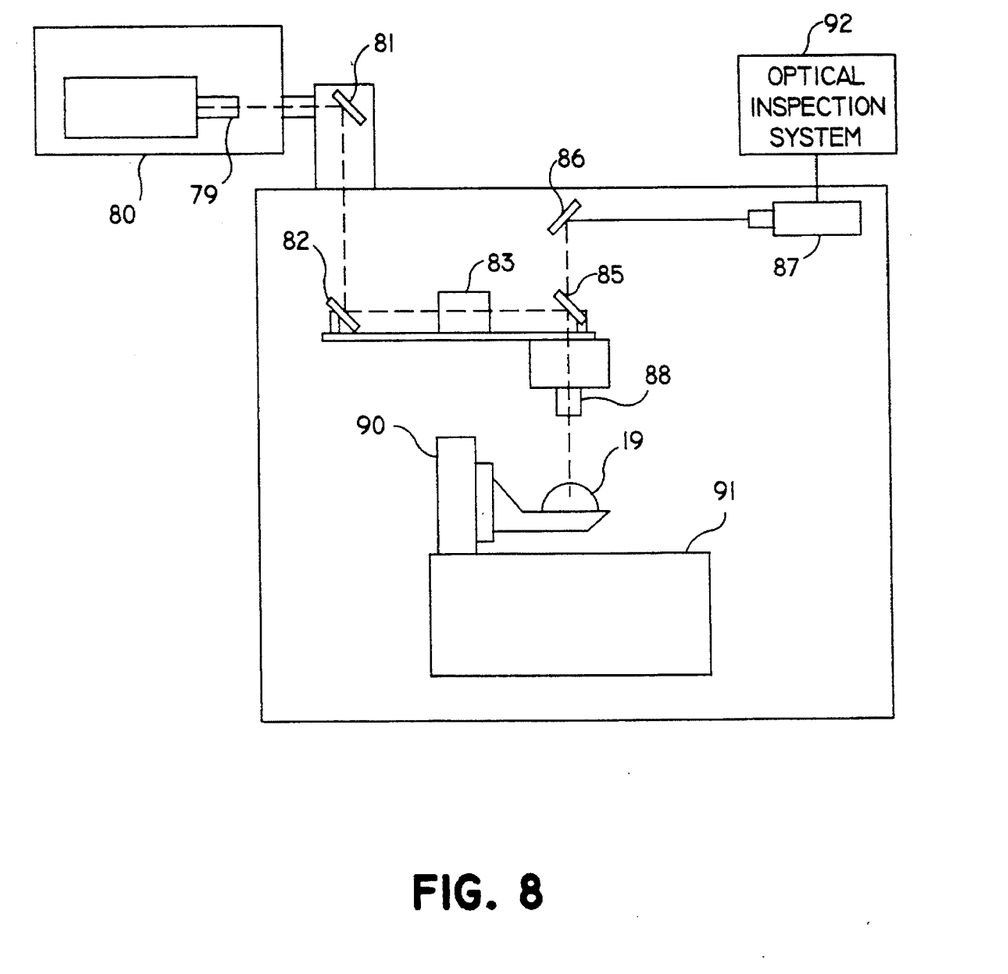
FIG. 8 is a schematic drawing of an apparatus for imaging and ablating the doubly contoured surface with a coherent light source and for displacing the doubly contoured surface relative to the coherent light source.

Referring now to FIG. 8, a schematic drawing illustrates a preferred apparatus for directly imaging the elements of the pattern on the radome 19 or for ablating the elements of the predetermined pattern on the radome 19. The apparatus preferably includes an excimer laser 80 which is commercially available as the Questex Series 2000 excimer laser. The laser can be incorporated into a five axis laser workstation of a type sold by Raytheon Corp. The excimer laser has a changeable lens 79 on the beam delivery system and a changeable gas mixture. Preferably, the laser 80 is set to operate at a wavelength of 354 nm when used to provide laser imaging of the first embodiment. When the laser 80 is used to perform laser ablation of the second and third embodiments, the laser is preferably set to operate at a wavelength of 248 nm.

The laser 80 also preferably includes a Powerlok feedback control system which maintains constant pulse energy as laser gain changes by controlling the high voltage. The laser gain usually decreases over time as the halogen (lasering gas) is depleted and as contaminants are produced. To maintain constant laser output, the Powerlok system starts at 60–70% of maximum pulse energy. The laser discharge voltage gradually increases as the gain decreases to maintain constant pulse energy at a predetermined level. The constant pulse energy is particularly significant for the laser imaging associated with the first embodiment. The apparatus of FIG. 8 can be used for all three embodiments of the invention, and the difference between the embodiments is the way the UV light is delivered to the substrate and the power and wavelength of that light.

The output of the laser 80 is directed towards mirrors 81, 82 and passed through a reticle 83. The image formed by the reticle 83 is directed to a dichromic mirror 85. The image is reflected by a mirror 86, and it is recorded by a video camera 87 of a closed circuit TV system. The image is also reflected from the dichromic mirror 85 through a focusing system 88 toward the radome 19. The radome 19 is disposed upon a tilt-rotation stage 90 and a X-Y table 91 which are capable of displacing the radome 19 with respect to the optical path of the excimer laser 80. The optical path may also include an additional mirror (not shown) disposed between the focussing system 88 and the radome 19 in order to bend the optical path 90°. The optional mirror can facilitate the imaging of the interior of the radome 19. Preferably, the tilt rotation stage 90 and X-Y table 91 comprise a five axis motion system having five degrees of freedom. The stages 90, 91 are preferably controlled by an Anorad numerical controller to provide five directions of movement. In other words, the radome can be displaced in an x, y, or z directions and two directions of rotation. The two directions of rotation and the displacement in the z direction is provided by the tilt-rotation stage 90. The displacement in the x and y directions are provided by the X-Y table 91.

The five axis motion system of FIG. 8 is controlled by the numerical controller and includes a suitable computer program. The computer software controls the distance of the focusing lens 88 to the surface of the radome 19. The software insures that the distance always stays the same, that the surface of the radome is perpendicular to the optical path to the laser 80 when an image is being printed and that the spacing between the elements on the radome 19 is maintained. The software would typically include a mathematical formula which would describe the contour of the surface to be imaged or it would provide data points corresponding to the contoured surface.

The camera 87 of the apparatus of FIG. 8 may also be coupled to an optical inspection system 92 for inspecting a printed circuit board or the radome 19. Coupling the camera 87 to an optical inspection system 92 permits on the fly inspection of the radome 19 during manufacture. The optical inspection system 92 takes the image from the camera 87, processes the image, and determines whether the radome 19 includes any defects. The defects can be detected by comparing the image formed by the camera 87 with an image stored in a digitized memory. If the defects are detected, the defects can, in many instances, be corrected during manufacturing, thereby avoiding the need to scrap the radome 19. Accordingly, the inclusion of an optical inspection system substantially improves the speed and efficiency of manufacturing three dimensional circuit boards or radomes.

While the invention has been described in its preferred embodiments, it is to be understood that the words that have been used are words of description rather than of limitation, and that changes within the purview of the present claims may be made without departing from the true scope of the invention in its broader aspects.

We claim:

1. A method for uniformly projecting a predetermined pattern onto a substantially nonplanar substrate having a three dimensionally curved surface, the substantially nonplanar substrate having a plurality of elements which form the predetermined pattern, comprising the steps of:

positioning the three dimensionally curved surface substantially normal to an optical path of a coherent light source;

directing light from the coherent light source along the optical path and through a reticle;

ablating a portion of the three dimensionally curved surface of the substantially nonplanar substrate, corresponding to an element of the predetermined pattern, with the coherent light source and the reticle, the reticle being located sufficiently distant from the three dimensionally curved surface to prevent ablated material from interfering with the reticle;

inspecting the ablated portion of the three dimensionally curved surface; and displacing the three dimensionally curved surface relative to the coherent light source in two degrees of rotational freedom and along one or more linear axes, in order to position another portion of the three dimensionally curved surface substantially normal to the optical path of the coherent light source;

wherein the directing, ablating, inspecting and displacing steps are repeated until the predetermined pattern is complete.

2. A method according to claim 1 wherein the ablating step includes the ablation of a resist material covering a metallized layer.

3. A method according to claim 2 which further includes the step of etching the metallized layer in the portions corresponding to the ablated resist material after the resist material has been ablated.

4. A method according to claim 2 wherein the coherent light source includes an excimer laser.

5. A method according to claim 1 wherein the ablating step includes the ablation of a metallized layer.

6. A method according to claim 5 wherein the coherent light source includes an excimer laser.

7. A method according to claim 1 wherein the substantially nonplanar substrate is a radome.

8. A method according to claim 1 wherein the substantially nonplanar substrate is a frequency selective surface.

9. A method according to claim 1 wherein the substantially nonplanar substrate is a printed circuit board.

10. A method according to claim 1 wherein the substantially nonplanar substrate is an electromagnetic shield.

11. A method according to claim 1 wherein the three dimensionally curved surface includes a three dimensional shape selected from the group consisting of a hemisphere and an ogive.

12. A method according to claim 1 which further includes disposing means for focussing between the reticle and the tree dimensionally curved surface.

13. A method according to claim 1 wherein the inspecting step includes imaging the ablated portion with a camera and processing the image to determine whether there are any defects.

* * * * *